United States Patent [19]

Matsui

[11] Patent Number: 4,710,962

[45] Date of Patent: Dec. 1, 1987

[54] SIGNAL CONTROL APPARATUS

[75] Inventor: Toshiyuki Matsui, Tokyo, Japan

[73] Assignee: Kabushiki Kaisha Kenwood, Japan

[21] Appl. No.: 797,664

[22] Filed: Nov. 13, 1985

[30] Foreign Application Priority Data

Nov. 14, 1984 [JP] Japan ............................ 59-172516[U]

[51] Int. Cl.$^4$ ............................................. H03G 5/00
[52] U.S. Cl. ..................................... 381/102; 381/109
[58] Field of Search ............... 381/109, 107, 104, 102, 381/101

[56] References Cited

U.S. PATENT DOCUMENTS

| 3,313,885 | 4/1967 | Aiken | 381/102 |
| 3,487,341 | 12/1969 | Grout | 381/102 |
| 3,732,373 | 5/1973 | Boyden | 381/102 |
| 4,031,319 | 6/1977 | Desai | 381/102 |
| 4,101,840 | 7/1978 | Fricke | 381/104 |
| 4,320,534 | 3/1982 | Sakai | 381/102 |
| 4,466,118 | 8/1984 | Dressler | 381/102 |

FOREIGN PATENT DOCUMENTS 54-37667  3/1979  Japan ................................. 381/102

Primary Examiner—Gene Z. Rubinson
Assistant Examiner—L. C. Schroeder
Attorney, Agent, or Firm—Gerald J. Ferguson, Jr.; Michael P. Hoffman; Michael J. Foycik, Jr.

[57] ABSTRACT

A signal control apparatus includes a circuit (26) for bearing a first characteristic to an original signal and outputting it as a first signal; a circuit (28) for bearing a second characteristic to the original signal and outputting it as a second signal; an adder circuit (30; 50) for adding the first and second signal with a variable proportion therebetween; and a control circuit (38) for controlling the variable proportion in accordance with the original signal in order to vary the output signal characteristic continuously.

4 Claims, 4 Drawing Figures

SIGNAL CONTROL APPARATUS

BACKGROUND OF THE INVENTION

1. Field of the Invention

The present invention relates to signal control apparatus. The invention is applicable for example to a loudness control circuit in an audio equipment such as a radio, player and deck provided with an electronic volume controller. The loudness control circuit embodying the present invention can automatically adjust the loudness of such audio equipment.

2. Description of the Prior Art

In the field of such as audio equipment and electric signal receivers, a signal control apparatus is known which can selectively choose the characteristic of a signal to be outputted.

For instance, in audio equipment such as radio receivers and players, volume control has been effected heretofore by means of a mechanical method of turning a volume controller. Recently, however, with the advent of various electronic devices, volume control is often effected by means of an electronic volume controller using for example a voltage controlled type variable gain circuit. Use of such an electronic volume controller enables the variation of sound intensity by manipulation of a key without necessitating the provision of conventional mechanical movable parts, thereby ensuring a high reliability and an improvement on operation performance.

Loudness control is commonly used, when the sound intensity is set at low levels in the middle of the night for example, to compensate for the reduced response of the ear to low and high frequency components.

As the volume controller in a conventional mechanical volume control circuit is turned to adjust the sound intensity, loudness control is effected whose characteristic automatically and proportionally varies with a change in sound intensity in accordance with an output from the loudness control tap of the volume controller.

However, a change in resistance of the mechanical volume controller at various setting positions affects the loudness characteristic. It is therefore difficult to obtain an ideal loudness characteristic suitable for auditory sensation.

In contrast with the mechanical volume controller, loudness control using an electronic volume controller has been used heretofore in the following way. As shown in FIG. 1, an audio signal is amplified by both flat circuit 10 and loudness circuit 12 so that two independent audio signals are produced, one having a flat frequency characteristic and the other having a loudness frequency characteristic. The output signals from the flat circuit 10 and loudness circuit 12 are coupled to a switching circuit 14 where the signals are selected in response to a switching signal S. That is, when the sound intensity is high, the output signal from the flat circuit 10 is outputted from the switching circuit 14, while at a low sound intensity, the signal from the loudness circuit 12 is outputted from the switching circuit 14.

Such loudness control has been found to be unsatisfactory in that it is cumbersome to manipulate not only the volume controller but also an ON/OFF switch for the loudness control, and furthermore in that unnatural sound with its low or high frequencies excessively emphasized may sometimes be produced at a certain sound intensity since the loudness characteristic does not vary in proportion to a change in sound intensity.

As described above, the conventional signal control apparatus selectively changing the characteristics of signals to be outputted has a problem associated with an continuous characteristic change.

SUMMARY OF THE INVENTION

It is an object of the present invention to solve the above problems and provide a signal control apparatus capable of changing the signal characteristic in a continuous way. To this end, according to the present invention, a signal representative of an original signal and having a first characteristic and a signal representative of the original signal and having a second characteristic are combined with variable proportion therebetween, and the proportion is controlled in accordance with the original signal.

DETAILED DESCRIPTION OF THE PREFERRED EMBODIMENTS

The present invention is applicable to a loudness control circuit, for example in the field of audio equipments. Examples of such application will be described with reference to the embodiments.

In the loudness control circuit of a first embodiment, the same audio signal is applied to both flat circuit and loudness circuit. The flat circuit has a flat frequency characteristic, while the loudness circuit has a predetermined loudness characteristic. Both flat and loudness circuits may be constructed, if necessary, to have the same output level at about 1 KHz. For instance, the flat circuit may be constructed to function as an attenuator.

The output signals from the flat and loudness circuits are added together by an adder circuit which has an electronic volume controller at the input side thereof and is constructed to realize a variable, proportional addition ratio between the two output signals.

Upon application to a control signal generator circuit of a signal indicative of a setting position of an electronic volume controller for volume control, a control signal is generated from the control signal generator circuit and delivered to the adder circuit to thereby vary the addition ratio in conformity with the sound intensity at that time.

Therefore, the proportion of the signal outputted from the flat circuit becomes large at high sound intensity, so that the output frequency characteristic is flat. Alternatively, the proportion of the signal outputted from the loudness circuit becomes large at low sound intensity. Consequently, loudness control is automatically effected obviating the necessity for the listener to manipulate to such effect. Furthermore, since a loudness control characteristic is possible which varies in proportion to a change in sound intensity, sound of a flat frequency characteristic in an auditory sense can always be obtained irrespective of a change in input sound intensity. In addition, since the loudness control circuit is separately provided from a volume controller circuit, the loudness control characteristic may be set as desired without being influenced by the position of the volume controller of the volume controller circuit. Thus, it is possible with simple circuit design to achieve an ideal characteristic suitable for auditory sensation.

Figure 1:
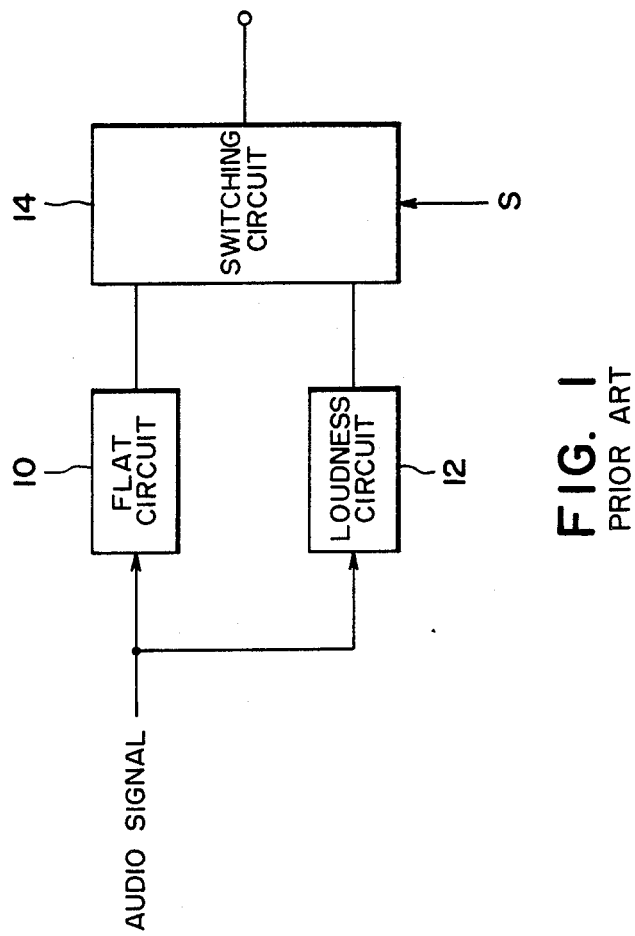
FIG. 1 is a block diagram showing a prior art loudness control circuit.
Figure 2:
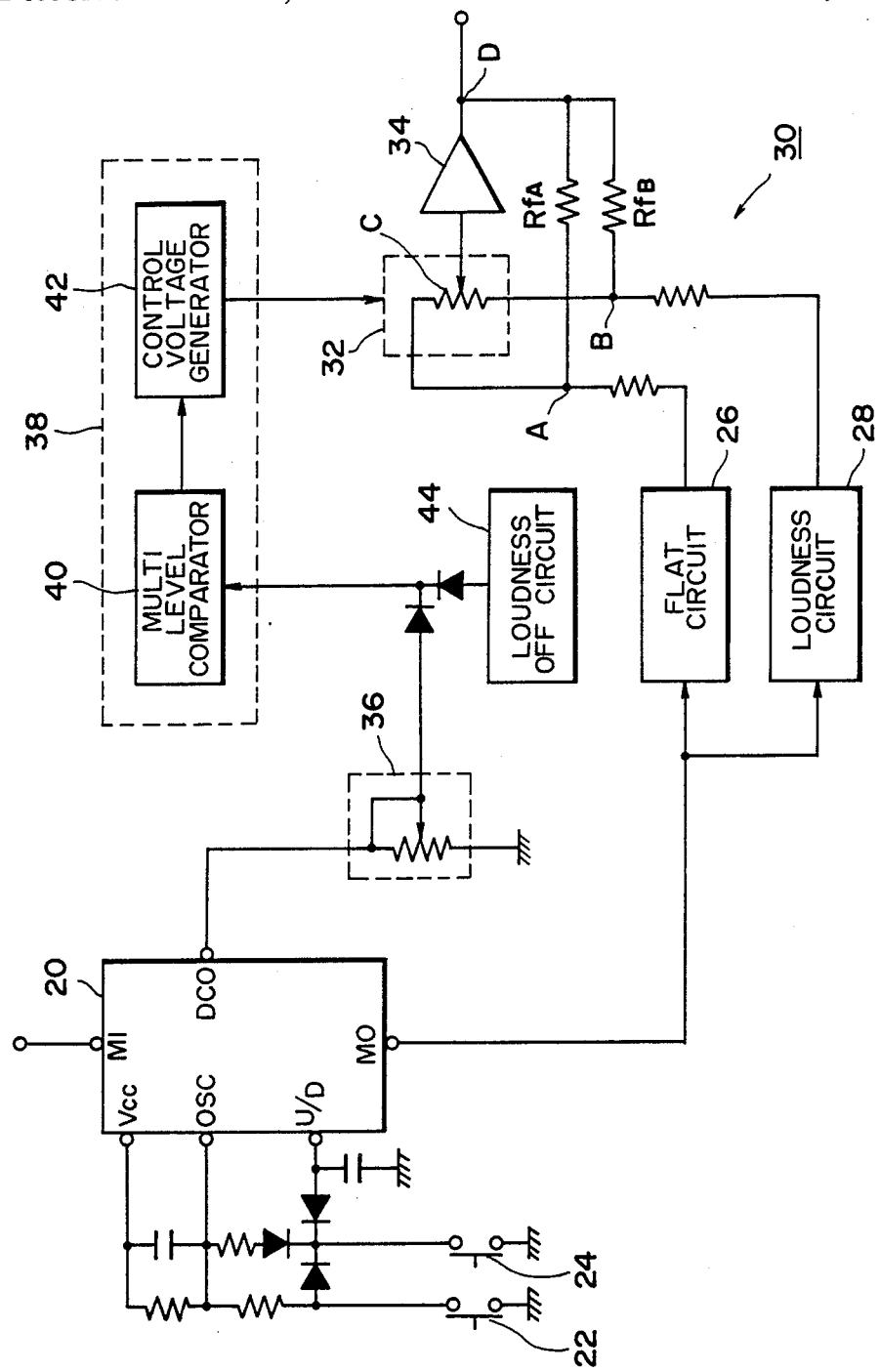
FIG. 2 is a block diagram showing an embodiment of the loudness control circuit according to the present invention.

FIG. 2 shows part of an audio equipment including the loudness control circuit according to the embodiment of the invention. In the figure, an electronic volume controller circuit 20 includes an up/down counter, D/A converter, voltage controlled type gain variable amplifier and so on. While an up-switch 22 is being depressed, the volume controller position goes up stepwise to gradually increase the gain for a music signal inputted from terminal MI. Conversely, while a down-switch 24 is being depressed, the volume controller position goes down stepwise to decrease the gain for the music signal.

The electronic volume controller circuit 20 is provided with terminal MO from which a properly amplified music signal is outputted and with terminal DCO from which a current is outputted which is indicative of the volume controller position and increases or decreases in magnitude in accordance with the volume controller position. A flat circuit 26 and a loudness circuit 28 are connected to terminal MO of the electronic volume controller circuit. Therefore, the amplified music signal is transformed at the flat circuit into a signal of a flat frequency characteristic, and at the loudness circuit 28 into a signal of a loudness frequency characteristic. The loudness circuit 28 is constructed to have a loudness characteristic to compensate for the reduced response of the ear at about minimum sound levels and realize a flat auditory sensation.

Both flat and loudness circuits 26 and 28 are arranged to have the same output level at about 1 KHz. For instance, in this embodiment the flat circuit 26 is constructed to function as an attenuator.

An adder circuit 30 is connected to the output sides of the flat circuit and loudness circuit 26 and 28. The adder circuit 30 is provided with an electronic volume controller 32 which is voltage-controlled to vary the proportion of the resistance on the side of input terminal A as seen from intermediate tap C to the resistance on the side of input terminal B. Intermediate tap C of the electronic volume controller 32 is connected to the input side of an amplifier 34 whose output side is connected to input terminals A and B respectively through feedback resistors $Rf_A$ and $Rf_B$.

Two output signals from the flat and loudness circuits 26 and 28 are added by a desired addition proportion therebetween at the adder circuit 30, and amplified by a preset gain factor. The added and amplified signal is then outputted from output terminal D to the following stage.

A rheostat 36 is connected to terminal DCO of the electronic volume controller circuit 20. The rheostat 36 converts a volume controller position indicating current outputted from terminal DCO into a volume controller position indicating voltage. The volume controller position voltage linearly increases or decreases in proportion to the volume controller position, or sound intensity, set with the up-switch 22 or down-switch 24.

A control signal generator circuit 38 is provided on the output side of the rheostat 36. The control signal generator circuit 38 controls the adder circuit 30 in accordance with sound intensity to accordingly vary the addition proportion of the adder circuit 30. The control signal generator circuit 38 is constructed of a multi-level comparator 40 coupled to the output of the rheostat 36 for A/D conversion, and a control voltage generator 42 coupled to the output of the multi-level comparator 40.

The multi-level comparator 40 includes a number of parallel-connected comparators so that the multi-level comparator 40 can compare an input voltage with a plurality of various reference voltages (which have previously been set at certain intervals). Thus, the comparators, whose input voltages are higher than the respective corresponding reference voltages, output in parallel high level signals.

The outputs or high level digital signals representative of the sound level are delivered to the control voltage generator 42 which generates a control voltage increasing or decreasing in magnitude in proportion to the sound level. The control voltage is applied to the electronic volume controller 32 of the adder circuit 30 for variable control of the addition proportion between the flat circuit 26 and the loudness circuit 28.

In particular, the resistance between intermediate tap C and input terminal A of the electronic volume controller 32 is made quite smaller than that between intermediate tap C to terminal B when the sound intensity is at about a maximum level. Therefore, the addition proportion of the flat circuit 26 side becomes large so that the output at terminal D of the amplifier 34 becomes of a flat frequency characteristic as indicated by I in FIG. 3. As the sound intensity decreases, the resistance between terminals C to A increases and hence the addition proportion of the loudness circuit 28 increases. So, the output from terminal D varies as indicated by II, III of FIG. 3, with gradually enhanced loudness effect.

Alternatively, the resistance between intermediate tap C and input terminal B is made quite smaller than that between intermediate tap C and terminal A when the sound intensity is at about a minimum level. Therefore, the addition proportion of the loudness circuit 26 side becomes large so that the output at terminal D becomes of the same frequency characteristic as that of the loudness circuit 28, as indicated by IV of FIG. 3.

Figure 3:
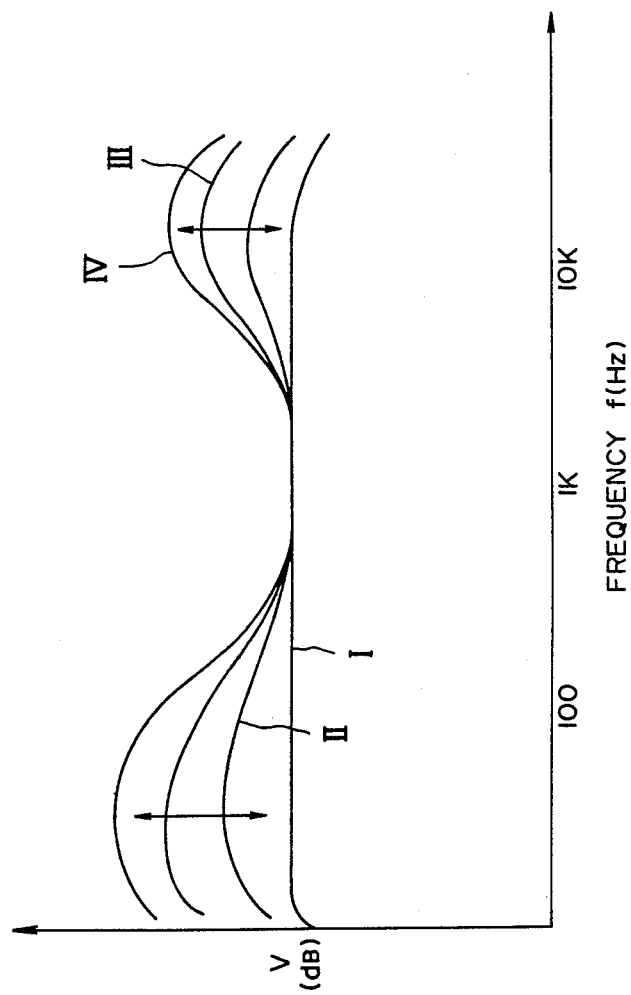
Fig. 3 is a graph for explaining the operation of the loudness control circuit of FIG. 2.

Under control of the control signal generator circuit 38, the audio or music signal outputted from terminal D is subjected to an automatic loudness control, and the degree of loudness control varies successively between I and IV as shown in FIG. 3 to effect a necessary loudness control for the sound intensity at that time.

To the input line of the control signal generator circuit 38, a loudness off circuit 44 is connected for making an audio signal from terminal D have a flat frequency characteristic irrespective of the sound intensity. The loudness off circuit 44 is provided with a switch which changes its state in response to a loudness off signal inputted from an external source, and a power source whose rated voltage equals the voltage to be outputted at the maximum sound intensity. If a loudness off signal is not applied, the loudness off circuit 44 operates to output a control voltage from the rheostat 36 directly to the control signal generator circuit 38, to thereby perform the above-described control operation for variable loudness characteristic. If on the other hand a loudness off signal is applied to the loudness off circuit 44 in response to a key manipulation by the listener, then the loudness off circuit 44 supplies the voltage for the maximum sound intensity to the control signal generator circuit 38 so as to control the electronic volume controller 32. Thus, the addition proportion of the flat circuit 26 is set at the largest level so that an audio signal from terminal D is made to have a flat frequency characteristic as indicated by I of FIG. 3 irrespective of the sound intensity.

As described in the foregoing, in the loudness control circuit of this embodiment, an audio signal is guided to two signal paths, one through the flat circuit and the other through the loudness circuit. The output signals are added together by the adder circuit, and the addition proportion therebetween is automatically changed in accordance with a signal indicative of the setting position of the electronic volume controller. Therefore, the proportion of the signal outputted from the flat circuit becomes large at high sound intensity, so that the output frequency characteristic is flat. Alternatively, the proportion of the signal outputted from the loudness circuit becomes large at low sound intensity. Consequently, loudness control is automatically effected obviating the necessity for the listener to manipulate to such effect. Furthermore, since a loudness control characteristic is possible which varies in proportion to a change in sound intensity, sound of a flat frequency characteristic in an auditory sense can always be obtained irrespective of a change in input sound intensity. In addition, since the loudness control circuit is separately provided from a volume controller circuit, the loudness control characteristic may be set as desired without being influenced upon the position of the volume controller of the volume controller circuit. Thus, it is possible with simple circuit design to achieve an ideal characteristic suitable for auditory sensation.

Figure 4:
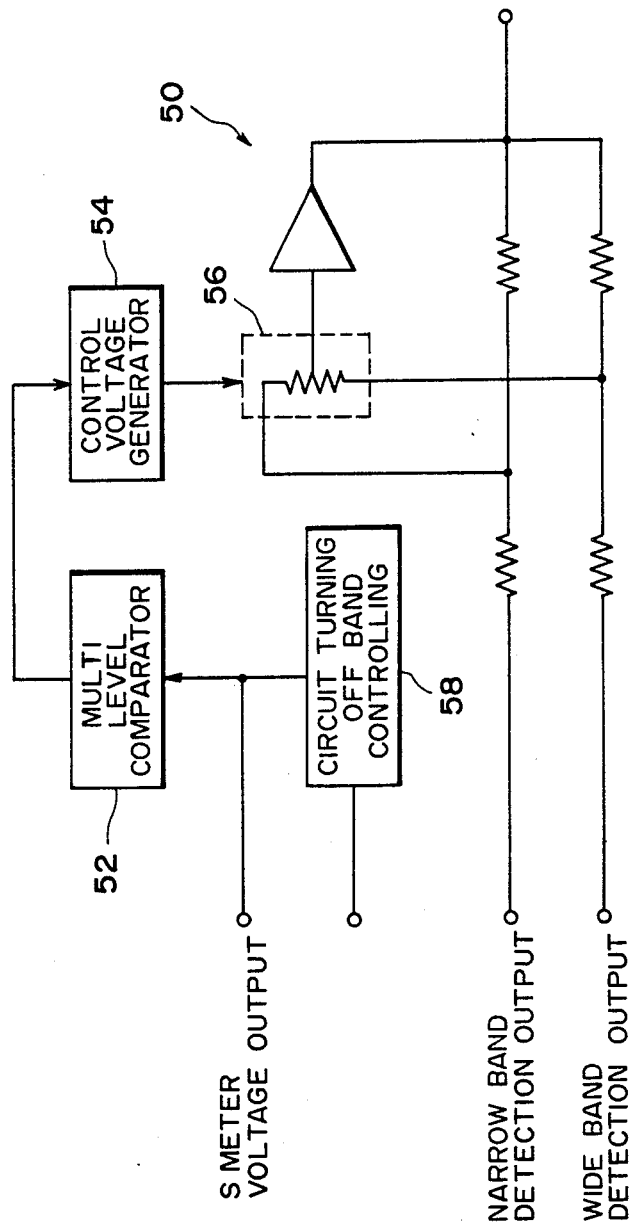
FIG. 4 is a block diagram showing another embodiment of the loudness control circuit according to the present invention.

The present invention is also applicable to an electric signal receiver. Such application will be described with reference to the embodiment. FIG. 4 shows the embodiment of an electric signal receiver. The electric signal receiver can be utilized as a bandwidth switching circuit which automatically switches in accordance with a received signal quantity such as electric field intensity. In FIG. 4, wide band and narrow band detection outputs are added together by an adder circuit 50 capable of changing the addition proportion. An S meter voltage output is converted into a digital value by a multi-level comparator 52 to generate from a control voltage generator 54 a corresponding control voltage which is applied to the adder circuit 50. If the intensity of electric field is high, the addition proportion of the wide band detection output is made large to raise the degree of fidelity, while if the intensity of electric field is low, the addition proportion of the narrow band detection output is made large to raise the degree of selectivity. Upon reception of a switching stop signal, a circuit 58 turning off band controlling outputs a high level voltage to the multi-level comparator 52 to fix the control operation of the electronic volume controller 56 so that always the narrow band detection output is delivered to the following stage.

We claim:

1. Loudness control circuitry comprising:
    a volume controller in response to a setting position for setting the magnitude level of an audio input signal;
    a first circuit for transmitting the magnitude level set audio input signal through a flat transmission characteristics with respect to frequencies;
    a second circuit for trasmitting the magnitude level set audio input signal through a loudness transmission characteristics with respect to frequencies; and
    an adder for summing the output from said first circuit and the output from said second circuit, the adder including means for adjusting the summing ratio of the outputs from said first and second circuit independence upon the volume controller setting position.

2. Loudness control circuitry according to claim 1, wherein said volume controller includes means for generating a voltage signal the magnitude of which corresponds to the setting position and the summing ratio in said summing ratio adjusting means is controlled by the voltage signal.

3. Loudness control circuitry according to claim 2, wherein the summing ratio adjusting means is electrically isolated from the voltage signal generating means.

4. Loudness control circuitry according to claim 2, further comprising a loudness-off circuit for generating a loudness-off voltage which corresponds to the voltage signal generated when the volume controller setting position is set for the maximum magnitude level, wherein
    in response to a loudness-off operation said loudness-off voltage is applied to control the summing ratio so that the output audio signal from said adder is substantially composed of the output from said first circuit.

* * * * *